United States Patent
Kalf et al.

(10) Patent No.: US 8,125,615 B2
(45) Date of Patent: Feb. 28, 2012

(54) OPTICAL FOCUS SENSOR, AN INSPECTION APPARATUS AND A LITHOGRAPHIC APPARATUS

(75) Inventors: Willem Kalf, Oosterhout (NL); Ronald Franciscus Herman Hugers, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 771 days.

(21) Appl. No.: 12/248,540

(22) Filed: Oct. 9, 2008

(65) Prior Publication Data

US 2009/0091726 A1   Apr. 9, 2009

Related U.S. Application Data

(60) Provisional application No. 60/960,644, filed on Oct. 9, 2007.

(51) Int. Cl.
*G03B 27/52*   (2006.01)
*G03B 27/72*   (2006.01)

(52) U.S. Cl. .......................... 355/55; 355/71
(58) Field of Classification Search ............. 355/52, 355/53, 55, 67–71; 356/399–401
See application file for complete search history.

(56) References Cited

U.S. PATENT DOCUMENTS

| | | | |
|---|---|---|---|
| 4,577,095 A | 3/1986 | Watanabe | |
| 4,742,218 A | 5/1988 | Nakamura et al. | |
| 4,844,617 A | 7/1989 | Kelderman et al. | |
| 5,747,813 A | 5/1998 | Norton et al. | |
| 7,177,012 B2 * | 2/2007 | Bleeker et al. | 355/69 |
| 7,202,953 B1 * | 4/2007 | Mueller et al. | 356/445 |
| 7,304,730 B2 * | 12/2007 | Inoue et al. | 356/237.1 |
| 7,791,727 B2 | 9/2010 | Den Boef et al. | |
| 2006/0066855 A1 | 3/2006 | Boef et al. | |
| 2008/0151228 A1 * | 6/2008 | Hugers | 356/73 |

FOREIGN PATENT DOCUMENTS

| | | |
|---|---|---|
| JP | 58-153327 A | 9/1983 |
| JP | 05-297262 A | 11/1993 |
| JP | 2006-060214 A | 3/2006 |
| WO | WO 00/42607 A1 | 7/2000 |

OTHER PUBLICATIONS

English language Abstract of Japanese Patent Publication No. 58-153327 A, Published Sep. 9, 1983; 1 page.

(Continued)

*Primary Examiner* — Hung Henry Nguyen
(74) *Attorney, Agent, or Firm* — Sterne, Kessler, Goldstein & Fox P.L.L.C.

(57) ABSTRACT

To detect whether a substrate is in a focal plane of an inspection apparatus, an optical focus sensor is arranged to receive a radiation beam via an objective lens. The optical focus sensor includes a splitter configured to split the radiation beam into a first sub-beam and a second sub-beam. With an aperture and a detector in the light path of each of the sub-beams it is possible to detect whether the substrate is in focus by comparing the amount of radiation received by each of the detectors.

11 Claims, 9 Drawing Sheets

OTHER PUBLICATIONS

English language Abstract of Japanse Patent Publication No. 05-297262 A, Published Nov. 12, 1993; 1 page.

English language Abstract of Japanese Patent Publication No. 2006-060214 A, Published Mar. 2, 2006; 1 page.

English translation of Japanese Notice for Reasons for Rejection directed to related Japanese Patent Application No. 2008-262636, Japanese Patent Office, dated Mar. 31, 2011; 6 pages.

Examination Report for Singapore Application No. 200807574-9 mailed Dec. 17, 2009, 9 pgs.

Tan, J. et al., "Theoretical analysis and property study of optical focus detection based on differential confocal microscopy," *Measurement Science and Technology*, vol. 13:1289-1293, IOP Publishing, United Kingdom (Aug. 2002).

European Search Report directed to related European Application No. 08 25 3285, European Patent Office, Munich, Germany, mailed on Dec. 27, 2011; 6 pages.

\* cited by examiner

OPTICAL FOCUS SENSOR, AN INSPECTION APPARATUS AND A LITHOGRAPHIC APPARATUS

CROSS-REFERENCE TO RELATED APPLICATIONS

This application claims the benefit of U.S. Provisional Application No. 60/960,644, filed Oct. 9, 2007, which is incorporated by reference herein in its entirety.

BACKGROUND

1. Field

Embodiments of the present invention relate to a method of inspection usable, for example, in the manufacture of devices by a lithographic technique and to a method of manufacturing devices using a lithographic technique.

2. Background

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

To determine features of a substrate, such as its alignment, a beam is typically redirected off the surface of the substrate, for example at an alignment target, and an image is created on a camera of the redirected beam. By comparing a property of the beam before and after it has been redirected by the substrate, a property of the substrate may be determined. This may be done, for example, by comparing the redirected beam with data stored in a library of known measurements associated with a known substrate property.

BRIEF SUMMARY

When detecting features of a pattern, the pattern should be in the focal plane of the optics. A method for determining whether a pattern on a substrate is in focus is the so-called "knife edge" method disclosed in U.S. patent application publication no. US 2006-0066855, which document is hereby incorporated in its entirety by reference. However, this method may be complicated and may require complex parts.

It is desirable, for example, to provide an apparatus for detecting whether the substrate is in focus.

According to an aspect of the invention, there is provided an optical focus sensor arranged to generate a focus error signal indicative of a position of a substrate relative to a focal plane of an objective lens, the optical focus sensor including: a splitter arranged and constructed to split a radiation beam into a first sub-beam and a second sub-beam associated with respectively a first and a second optical branch; the splitter being further arranged and constructed to direct the first sub-beam to a first detector via a first aperture, and to direct the second sub-beam to a second detector via a second aperture wherein the first aperture is positioned between a first back focal plane of the objective lens in the first optical branch and the first detector; and the second aperture is positioned between the objective lens and a back focal plane a second back focal plane of the objective lens in the second optical branch.

BRIEF DESCRIPTION OF THE DRAWINGS/FIGURES

Embodiments of the invention will now be described, by way of example only, with reference to the accompanying schematic drawings in which corresponding reference symbols indicate corresponding parts, and in which:

FIG. 1a schematically depicts a lithographic apparatus in accordance with an embodiment of the invention;

DETAILED DESCRIPTION

Figure 1A:
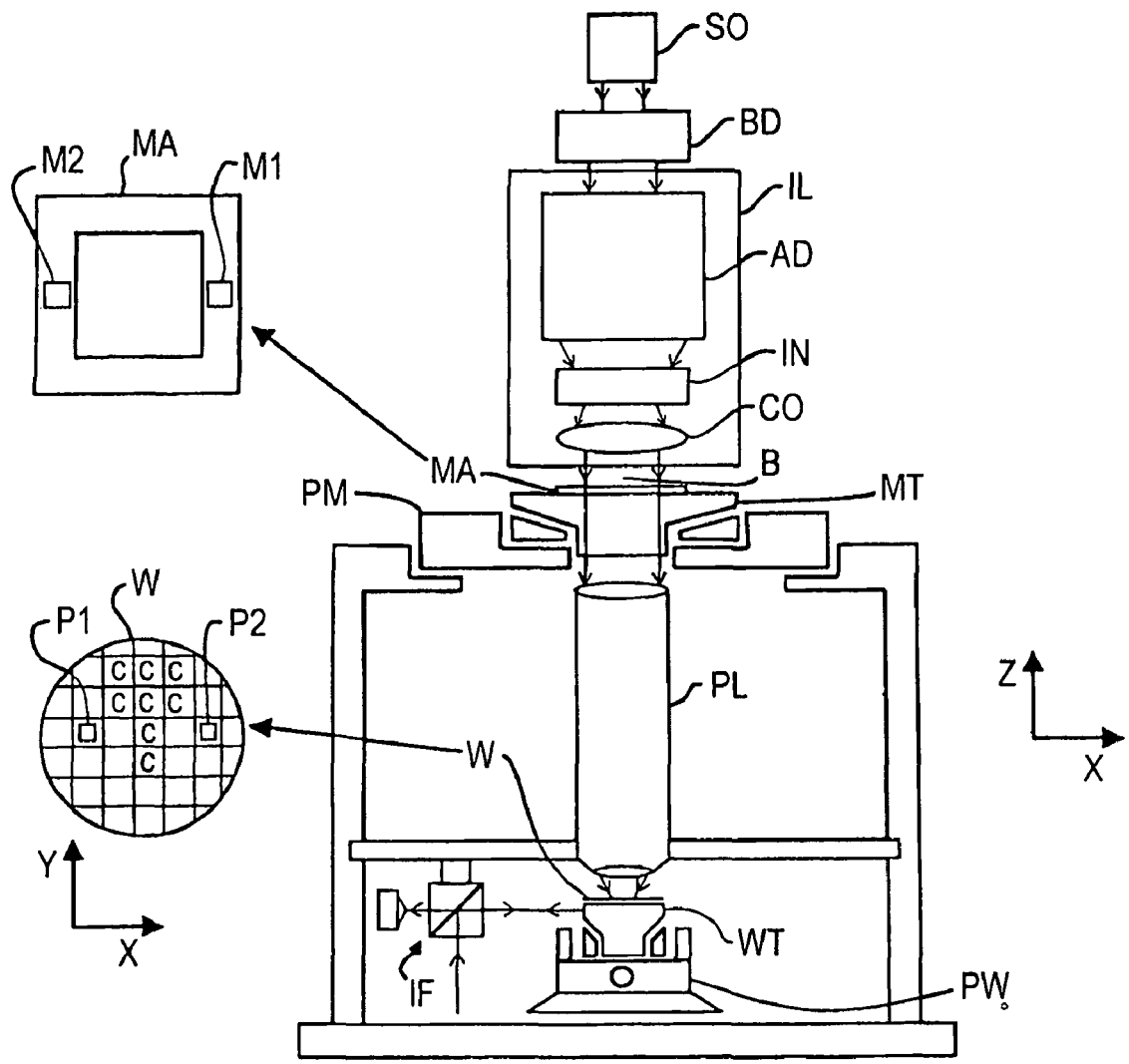
FIG. 1b shows that the lithographic apparatus, controlled by a lithographic apparatus control unit, forms part of a lithographic cell in accordance with an embodiment of the invention.

FIG. 1a schematically depicts a lithographic apparatus in accordance with an embodiment of the invention. The apparatus includes: an illumination system, illuminator IL configured to condition a radiation beam B, e.g. UV radiation or EUV radiation; a support structure, e.g. a mask table, MT constructed to support a patterning device, e.g. a mask, MA and connected to a first positioner PM configured to accurately position the patterning device in accordance with certain parameters; a substrate table, e.g. a wafer table, WT constructed to hold a substrate (e.g. a resist-coated wafer) W and connected to a second positioner PW configured to accurately position the substrate in accordance with certain parameters; and a projection system, e.g. a refractive projection lens system, PL configured to project a pattern imparted to the radiation beam B by patterning device MA onto a target portion C, e.g. including one or more dies, of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables and/or support structures may be used in parallel, or preparatory steps may be carried out on one or more tables and/or support structures while one or more other tables and/or support structures are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1a, illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from source SO to illuminator IL with the aid of a beam delivery system BD including, for example, suitable directing mirrors and/or a beam expander. In other cases the source may be an integral part of the lithographic apparatus, for example when the source is a mercury lamp. Source SO and illuminator IL, together with beam delivery system BD if required, may be referred to as a radiation system.

Illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, illuminator IL may include various other components, such as an integrator IN and a condenser CO. The illuminator may be used to condition the radiation beam, to have a desired uniformity and intensity distribution in its cross-section.

Radiation beam B is incident on patterning device (e.g., mask) MA, which is held on support structure (e.g., mask table) MT, and is patterned by the patterning device. Having traversed patterning device MA, radiation beam B passes through projection system PL, which transmits the beam onto a target portion C of substrate W. With the aid of second positioner PW and position sensor IF (e.g. an interferometric device, linear encoder or capacitive sensor), substrate table WT can be moved accurately, e.g. so as to position different target portions C in the path of radiation beam B. Similarly, first positioner PM and another position sensor (which is not explicitly depicted in FIG. 1a) can be used to accurately position patterning device MA with respect to the path of radiation beam B, e.g. after mechanical retrieval from a mask library, or during a scan. In general, movement of support structure MT may be realized with the aid of a long-stroke module (coarse positioning) and a short-stroke module (fine positioning), which form part of first positioner PM. Similarly, movement of substrate table WT may be realized using a long-stroke module and a short-stroke module, which form part of second positioner PW. In the case of a stepper (as opposed to a scanner) support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on patterning device MA, the patterning device alignment marks may be located between the dies.

The depicted apparatus could be used in at least one of the following modes:

1. In step mode, support structure MT and substrate table WT are kept essentially stationary, while an entire pattern imparted to the radiation beam is projected onto a target portion C at one time (i.e. a single static exposure). Substrate table WT is then shifted in the X and/or Y direction so that a different target portion C can be exposed. In step mode, the maximum size of the exposure field limits the size of the target portion C imaged in a single static exposure.

2. In scan mode, support structure MT and substrate table WT are scanned synchronously while a pattern imparted to the radiation beam is projected onto a target portion C (i.e. a single dynamic exposure). The velocity and direction of substrate table WT relative to support structure MT may be determined by the (de-)magnification and image reversal characteristics of projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, support structure MT is kept essentially stationary holding a programmable patterning device, and substrate table WT is moved or scanned while a pattern imparted to the radiation beam is projected onto a target portion C. In this mode, generally a pulsed radiation source is employed and the programmable patterning device is updated as required after each movement of substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 1B:
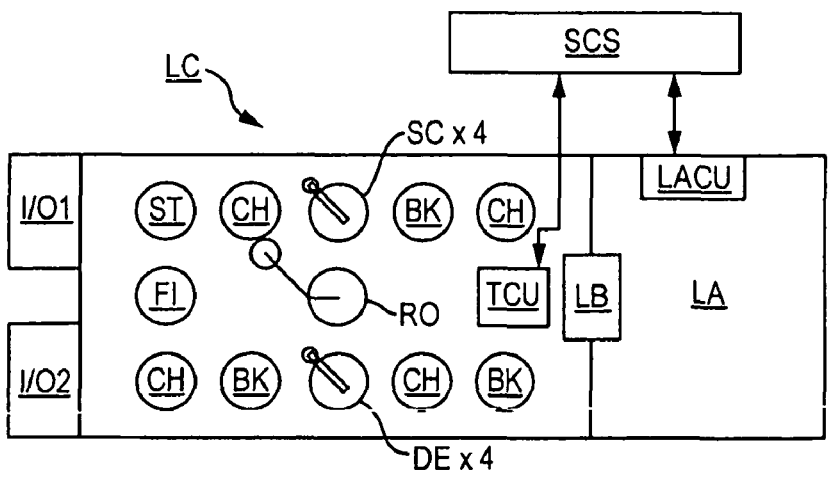

FIG. 1b shows that lithographic apparatus LA, controlled by a lithographic apparatus control unit LACU, forms part of a lithographic cell LC, also sometimes referred to as a lithocell or lithocluster, which also includes apparatus to perform one or more pre- and post-exposure processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process devices and delivers it to a loading bay LB of the lithographic apparatus. These devices, which are often collectively referred to as the track, are under the control of a track control unit TCU which is itself controlled by a supervisory control system SCS, which also controls the lithographic apparatus via lithographic apparatus control unit LACU. Thus, the different apparatus may be operated to maximize throughput and processing efficiency.

In order that the substrate that is exposed by the lithographic apparatus is exposed correctly and consistently for each layer of resist, it is desirable to inspect an exposed substrate to measure one or more properties such as whether changes in alignment, rotation, etc., overlay error between subsequent layers, line thickness, critical dimension (CD), etc. If an error or change is detected, an adjustment may be made to an exposure of one or more subsequent substrates, especially if the inspection can be done soon and fast enough that another substrate of the same batch is still to be exposed. Also, an already exposed substrate may be stripped and reworked—to improve yield—or discarded—thereby avoiding performing an exposure on a substrate that is known to be faulty. In a case where only some target portions of a substrate are faulty, a further exposure may be performed only on those target portions which are good. Another possibility is to adapt a setting of a subsequent process step to compensate for the error, e.g. the time of a trim etch step can be adjusted to compensate for substrate-to-substrate CD variation resulting from the lithographic process step.

An inspection apparatus is used to determine one or more properties of a substrate, and in particular, how one or more properties of different substrates or different layers of the same substrate vary from layer to layer and/or across a substrate. The inspection apparatus may be integrated into lithographic apparatus LA or lithocell LC or may be a stand-alone device. To enable most rapid measurements, it is desirable that the inspection apparatus measure one or more properties in the exposed resist layer immediately after the exposure.

Figure 2:
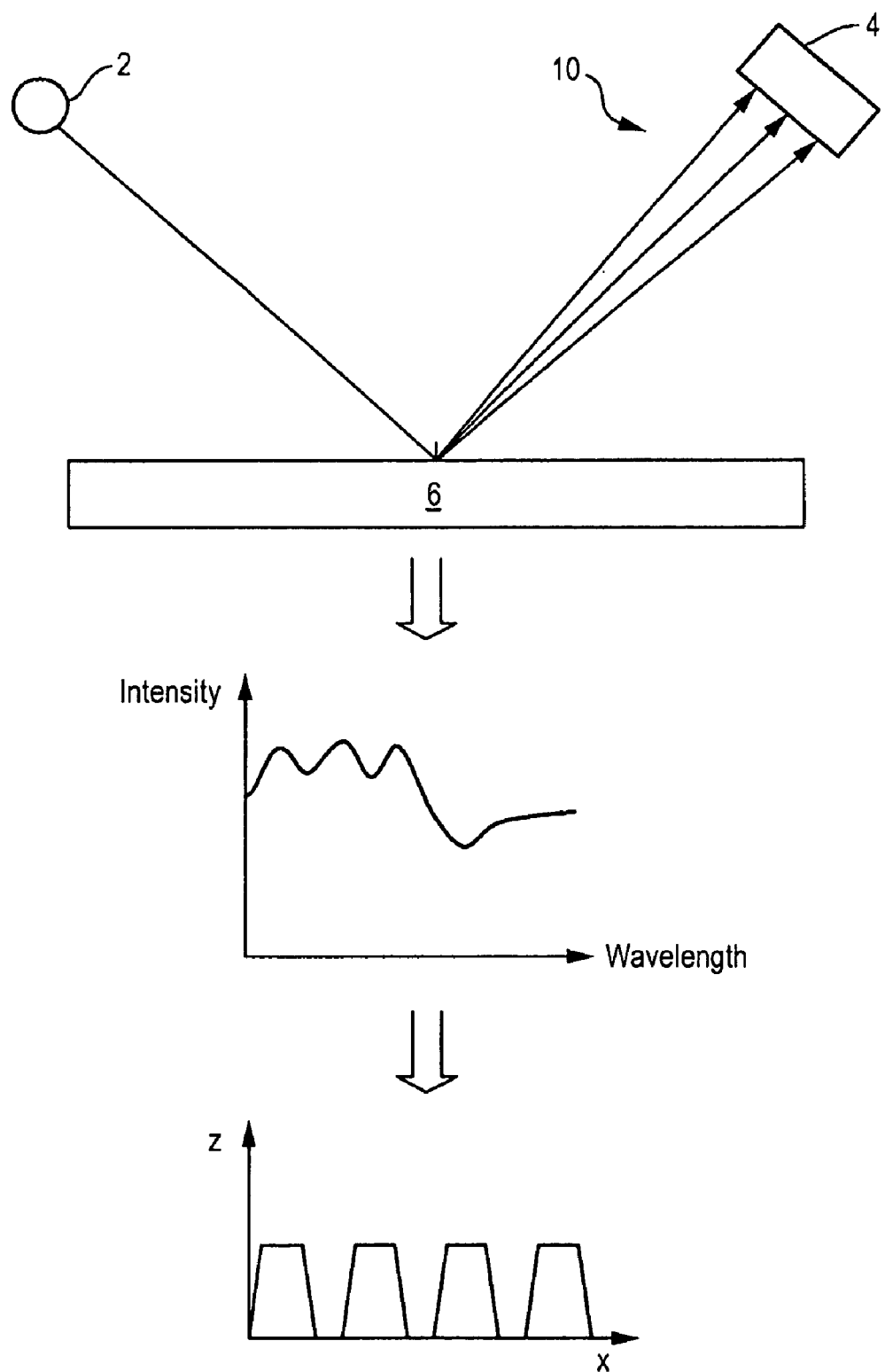
FIG. 2 depicts an inspection apparatus such as a scatterometer that may be used to determine one or more properties of the surface of a substrate in accordance with an embodiment of the invention.

FIG. 2 depicts an inspection apparatus such as a scatterometer that can be used to determine one or more properties of the surface of a substrate, such as substrate W from FIG. 1a. However, also other inspection devices may be used, such as an ellipsometer.

The scatterometer may include a broadband (white light) radiation projector 2 which projects radiation onto a substrate 6. The reflected radiation is passed to a spectrometer detector 4, which measures a spectrum 10 (i.e. a measurement of intensity as a function of wavelength) of the specular reflected radiation. From this data, the structure or profile giving rise to the detected spectrum may be reconstructed by a processing unit, e.g. by Rigorous Coupled Wave Analysis and non-linear regression or by comparison with a library of simulated spectra as shown at the bottom of FIG. 2. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer. A variant of scatterometry may also be used in which the reflection is measured at a range of angles of a single wavelength, rather than the reflection at a single angle of a range of wavelengths.

Figure 3:
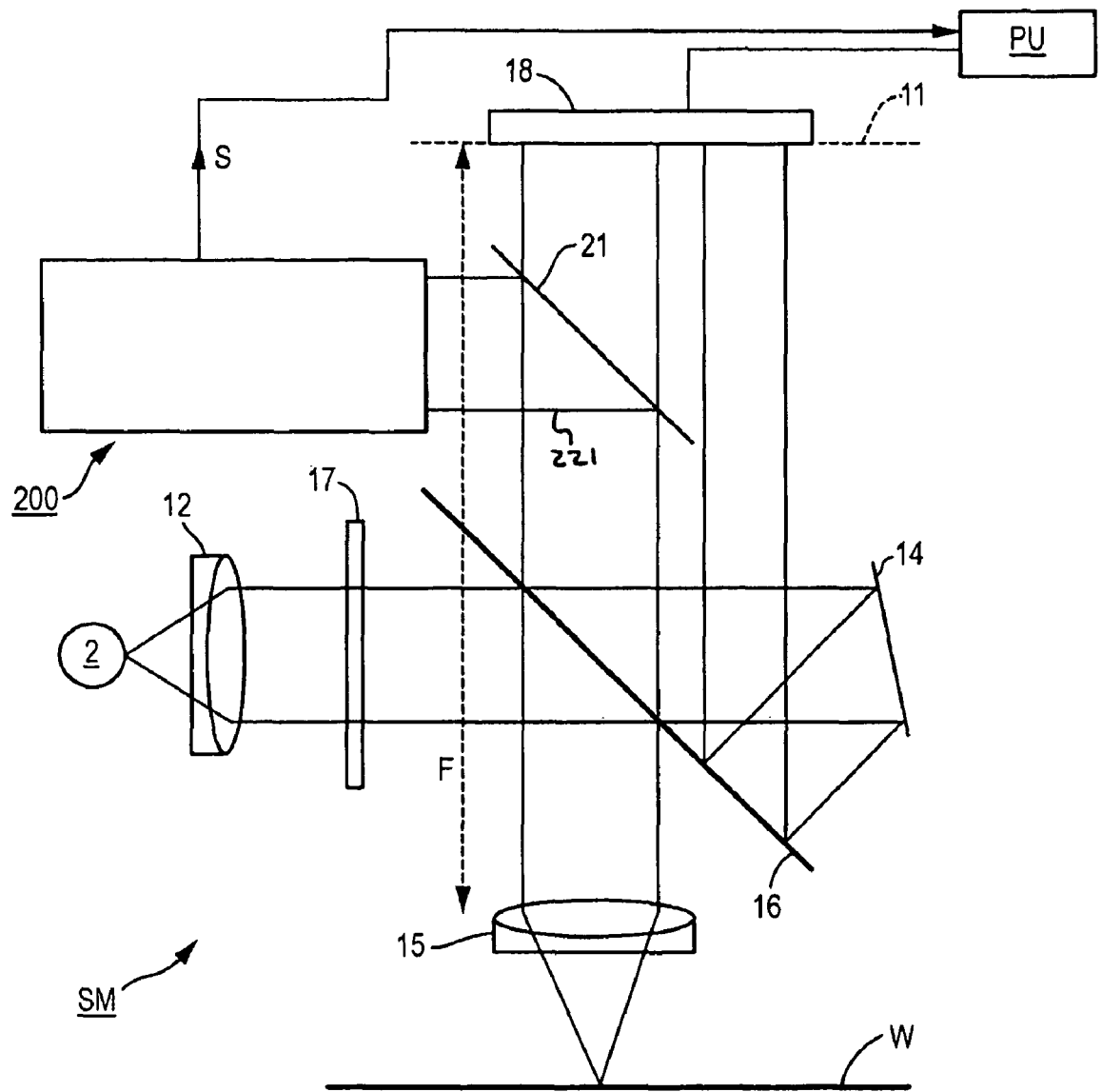
FIG. 3 shows a scatterometer configured to measure, in the pupil plane of a high numerical aperture lens, the properties of an angle-resolved spectrum reflected from the substrate surface at a plurality of angles and wavelengths in accordance with an embodiment of the invention.

A scatterometer SM according to an embodiment is shown in FIG. 3. Scatterometer SM is configured to measure, in the pupil plane of a high numerical aperture lens, the properties of an angle-resolved spectrum reflected from a substrate surface W at a plurality of angles and wavelengths. Such a scatterometer may include a radiation projector 2 configured to project radiation onto substrate W and a detector 18 configured to detect the reflected spectra. The detector is in communication with a processing unit PU. The radiation emitted by radiation source 2 is focused using lens system 12 through a interference filter (not shown) and polarizer 17, reflected by partially reflective surface 16 and is focused onto substrate W via an objective lens 15, which may have a high numerical aperture (NA). In an embodiment, the NA is at least 0.9. In another embodiment, the NA is over 1. The reflected radiation then transmits through partially reflective surface 16 into detector 18 in order to have the scatter spectrum detected. The pupil plane is the plane in which the radial position of radiation defines angle of incidence and the angular position defines azimuth angle of the radiation. The detector may be located in the back-projected pupil plane 11 which is at focal length of the lens system 15. However, the pupil plane may instead be re-imaged with auxiliary optics (not shown) onto detector 18.

A reference beam is often used, for example, to measure the intensity of the incident radiation. In order to do this, when the radiation beam is incident on partially reflective surface 16, part of the radiation beam is transmitted through the surface as a reference beam towards a reference mirror 14. The reference beam is then projected onto a different part of the same detector 18.

The reflected radiation is imaged on detector 18, which may be for example a CCD detector, which may have an integration time of, for example, 40 milliseconds per frame. In this way, a two-dimensional angular scatter spectrum of the substrate target is imaged on the detector. The detector may be, for example, an array of CCD or CMOS sensors.

One or more interference filters (not shown) may be available to select a wavelength of interest in the range of, say, 405-790 nm or even lower, such as 200-300 nm. The interference filter(s) may be tunable rather than including a set of different filters. A grating may be used instead of or in addition to one or more interference filters.

Detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light. The target on substrate W may be a grating which is printed such that after development, the bars are formed of solid resist lines. The bars may alternatively be etched into the substrate. The target pattern is chosen to be sensitive to a parameter of interest, such as focus, dose, overlay, chromatic aberration in the lithographic projection apparatus, etc., such that variation in the relevant parameter will manifest as variation in the printed target. For example, the target pattern may be sensitive to chromatic aberration in the lithographic projection apparatus, particularly projection system PL, and illumination symmetry and the presence of such aberration will manifest itself in a variation in the printed target pattern. Accordingly, the scatterometry data of the printed target pattern is used to reconstruct the target pattern. The parameters of the target pattern, such as line width and shape, may be input to the reconstruction process, performed by a processing unit, from knowledge of the printing step and/or other scatterometry processes.

In an embodiment the scatterometer is provided with an optical focus sensor 200 and a beamsplitter 21 in order to detect whether substrate W is in focus of objective lens 15. Beamsplitter 21 receives the reflected radiation beam from substrate W via partially reflecting surface 16 and diverts a light beam portion 221 of the reflected radiation beam towards optical focus sensor 200. Optical focus sensor 200 generates an output signal S which is provided to control unit PU via which the position of substrate W relative to objective lens 15 may be adjusted.

Figure 4A:
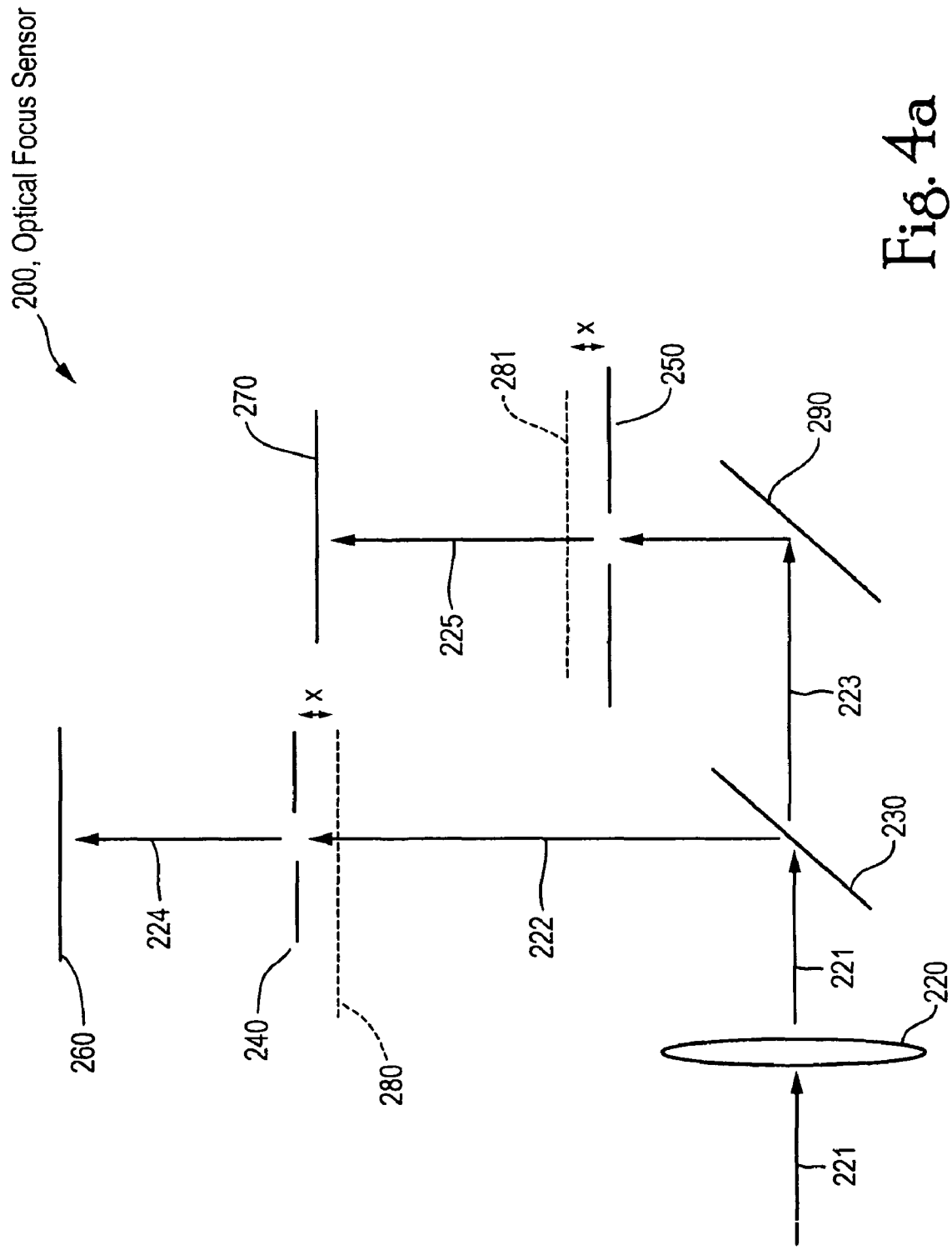
FIG. 4a depicts an optical focus sensor that includes a lens or optical system, a splitter, a mirror, a first aperture, a second aperture, a first detector and a second detector in accordance with an embodiment of the invention.

FIG. 4a depicts an embodiment of an optical focus sensor 200 that includes a lens or optical system 220, a splitter 230, a mirror 290, a first aperture 240, a second aperture 250, a first detector 260 and a second detector 270. Lens 220 receives light beam portion 221 and transmits this light beam portion 221 to splitter 230. Splitter 230 splits transmitted light beam portion 221 into a first sub-beam 222 associated with a first optical branch and a second sub-beam 223 associated with a second optical branch. Each optical branch has a back focal plane corresponding with objective lens 15, i.e. the first sub-beam 222 has a first back focal plane 280 and the second sub-beam has a second back focal plane 281. These focal planes are each in a predetermined distance from the substrate.

In the first optical branch, a first aperture 240 is arranged, seen along the light path of first sub-beam 222 in the direction from splitter 230 to first back focal plane 280, between first back focal plane 280 and a first detector 260. In operation, splitter 230 directs first sub-beam 222 towards first aperture 240. First sub-beam 222 passes entirely or partly first aperture 240, resulting in a first passed beam-portion 224. The portion of first sub-beam 222 that passes first aperture 240 is proportional to the distance between substrate W and objective lens 15. First detector 260 receives first passed beam-portion 224, which first detector 260 may be arranged to detect the intensity or the amount of radiation that is received via first aperture 240. However, first detector 260 may also be arranged to detect the size and/or the shape of the spot incident on first detector 260.

In the second optical branch, a second aperture 250 is arranged, seen along the light path of second sub-beam 223 in the direction from splitter 230 to second back focal plane 281, in front (i.e., upstream in the light path) of second back focal plane 281. A mirror 290 is arranged in the light path of second back focal plane 281 between splitter 230 and second aperture 250. A second detector 270 is arranged, seen along the light path of second sub-beam 223 in the direction from splitter 230 to second back focal plane 281, behind second back focal plane 281. In operation, mirror 290 directs second sub-beam 223 towards second aperture 250. Second sub-beam 223 passes entirely or partly second aperture 250, resulting in a second passed beam-portion 225. The portion of second sub-beam 223 that passes second aperture 250 is proportional to the distance between substrate W and objective lens 15. A second detector 270 receives second passed beam-portion 225, which second detector 270 may be arranged to detect the intensity or the amount of radiation that is received via second aperture 250. However, second detector 270 may also be arranged to detect the size and/or the shape of the spot incident on second detector 270.

Apertures 240, 250 may be arranged both at a distance x from back focal planes 280, 281. However, it may also be possible that the distance between an aperture and a back focal plane is different for each aperture.

In operation, and when substrate W is in focus, first passed beam-portion 224 and second passed beam-portion 225 are substantially equal so that first detector 260 and second detector 270 detect substantially the same amount of radiation (or the same size/shape of the spot projected onto detectors 260 and 270).

Figure 5A:
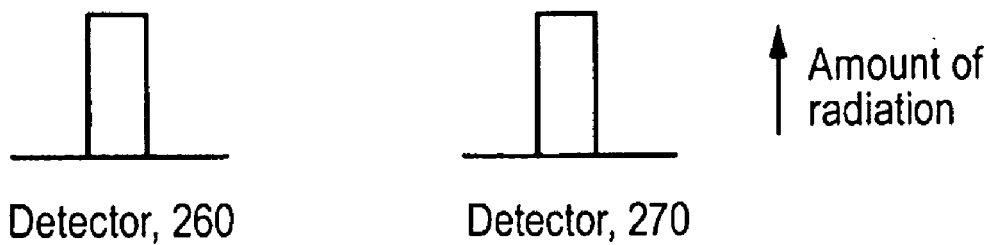
FIG. 5a shows two exemplary graphs of the amounts of radiation received by two respective detectors in the case the substrate is at an optimal position relative to the objective lens.
Figure 5B:
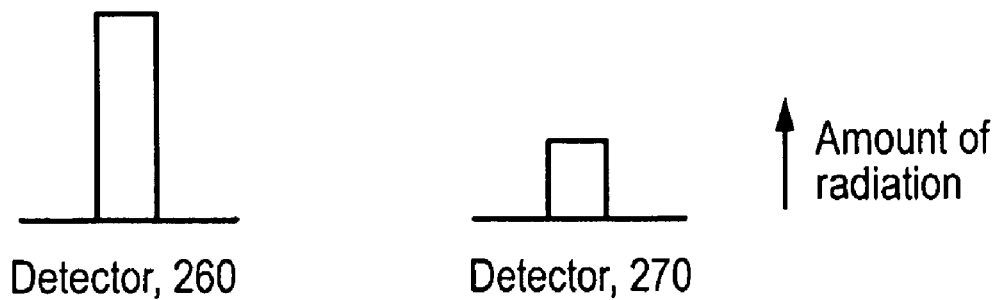
FIG. 5b shows two exemplary graphs of the amounts of radiation received by two respective detectors corresponding to the situation that the position of the substrate relative to the objective lens is too large.
Figure 5C:
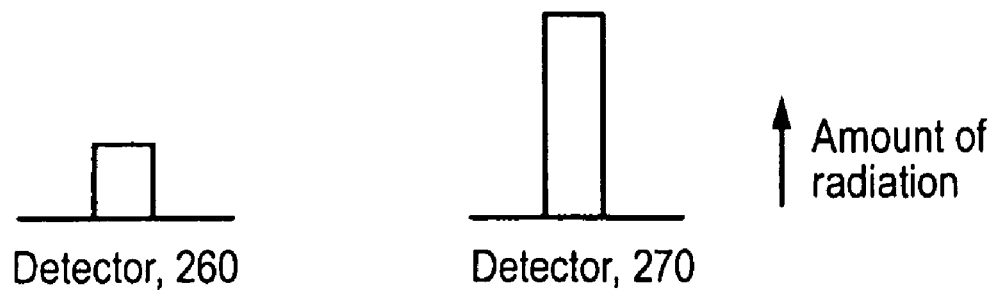
FIG. 5c shows two exemplary graphs of the amounts of radiation received by two respective detectors corresponding to the situation that the position of the substrate relative to the objective lens is too small.

FIG. 5a shows two exemplary graphs of amounts of radiation received by respective detectors 260 and 270 in the case substrate W is at an optimal position relative to objective lens 15. In that case both amounts are equal. FIG. 5b shows exemplary two graphs of amounts of radiation received by respective detectors 260 and 270 corresponding to the situation that the position of substrate W relative to objective lens 15 is too large. The amount of radiation received by detector 260 is then higher than the amount of radiation received by detector 270. FIG. 5c shows two exemplary graphs of amounts of radiation received by respective detectors 260 and 270 corresponding to the situation that the position of substrate W relative to objective lens 15 is too small. The amount of radiation received by detector 260 is then less than the amount of radiation received by detector 270.

Figure 5D:
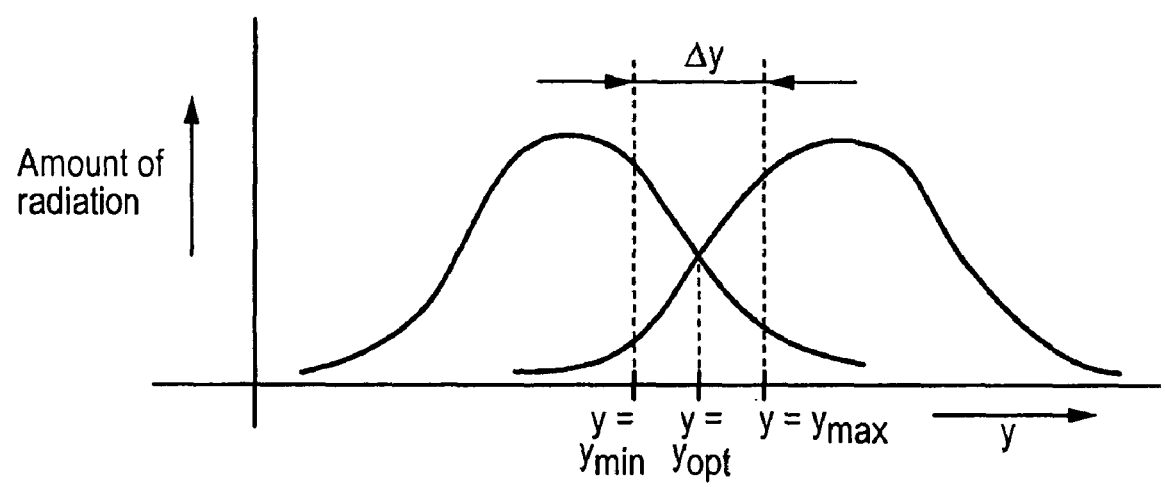
FIG. 5d shows two exemplary graphs of the amounts of radiation received by two respective detectors as a function of the distance between the substrate and the objective lens.

Because two sub-beams are used to determine if substrate W is in focus, it is possible to determine in which direction the distance between substrate W and objective lens 15 should be changed in order to get substrate W in an optimal position relative to objective lens 15. This is because the situation in which the distance is too large (FIG. 5b) and the situation that the distance is too small (FIG. 5c) can be distinguished so that it can be determined whether to reduce or increase the distance between substrate W and objective lens 15. FIG. 5d shows two exemplary graphs of the amounts of radiation received by respective detectors 260 (left graph) and 270 (right graph) as a function of the distance y between substrate W and objective lens 15. At a distance $y=y_{opt}$, substrate W is at an optimal position relative to objective lens 15, which corresponds to the situation that both amounts of radiation are equal. In general, there will be a capture range $\Delta y$ defined by values $y=y_{min}$ and $y=y_{max}$ within which the optical focus sensor is operational. If the optical focus sensor operates in the capture range $\Delta y$ and the amount of radiation received by first detector 260 is higher than the amount of radiation received by second detector 270, it can be seen from FIG. 5d that the distance y should be enlarged in order to achieve an optimal position of substrate W relative to objective lens 15. On the other hand, if the optical focus sensor operates in the capture range $\Delta y$ and the amount of radiation received by first detector 260 is less than the amount of radiation received by second detector 270, it can be seen from FIG. 5d that the distance y should be reduced in order to achieve an optimal position of substrate W relative to objective lens 15.

As shown in FIG. 4a the path length between objective lens 15 and the first back focal plane is the same as the path length between objective lens 15 and second back focal plane. However, it might be the case that, for instance due to the nature of the optical elements applied in the configuration, there is a difference between the two path lengths. For instance, this may occur when a wedge is placed in the optical path of one of the sub-beams. The optical properties of the wedge material will result in a longer path length for the sub-beam passing through the wedge.

Figure 4B:
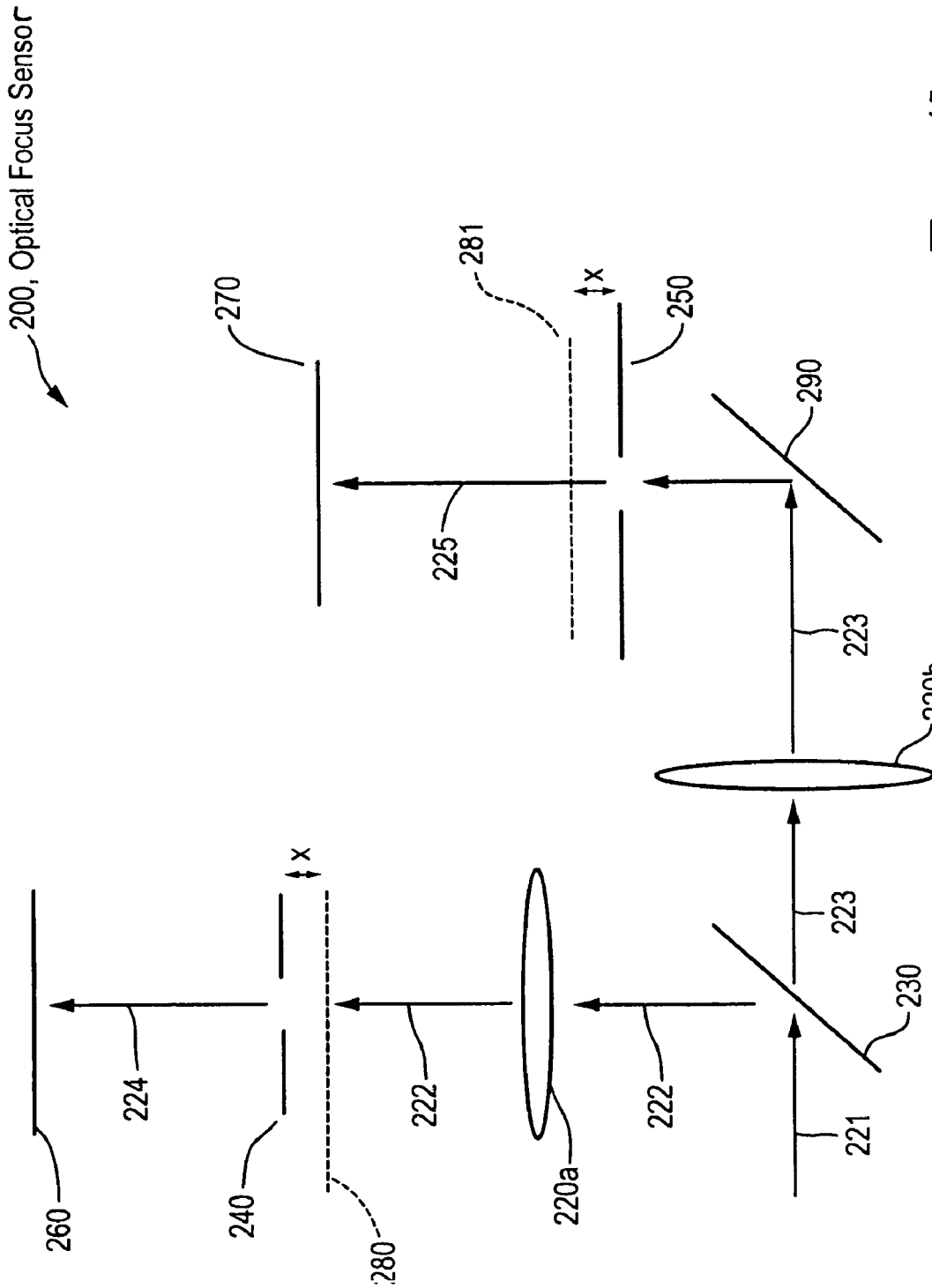
FIG. 4b depicts an optical focus sensor that includes two lenses, one for each sub-beam, arranged behind the splitter in accordance with an embodiment of the invention.

FIG. 4b depicts an embodiment of optical focus sensor 200 that includes two lenses 220a and 220b, one for each sub-beam, arranged behind splitter 230. Lens 220a transmits first sub-beam 222 to first aperture 240 and lens 220b transmits second sub-beam beam 223, via mirror 290, to second aperture 250. Also in this embodiment the path length between objective lens 15 and first back focal plane 280 is substantially the same as the path length between objective lens 15 and second back focal plane 281.

Figure 4C:
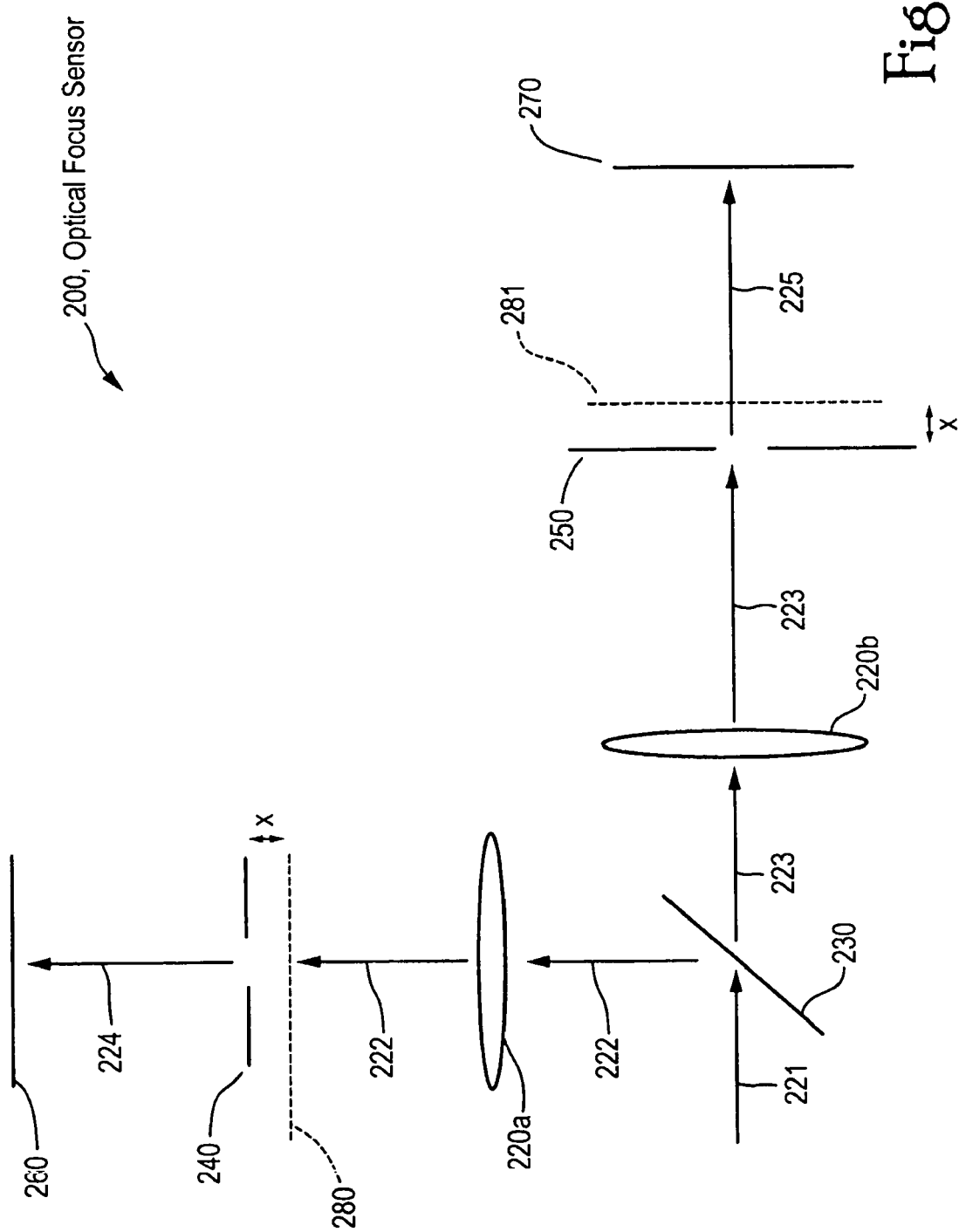
FIG. 4c depicts an optical focus sensor in accordance with an embodiment of the invention.

FIG. 4c depicts another embodiment of optical focus sensor 200. In this embodiment lens 220b transmits second sub-beam 223 directly to second aperture 250.

Although these examples have a single first detector 260 and a single second detector 270, each of the first detector 260 and second detector 270 may be divided into a plurality of sub-detectors.

Figure 6:
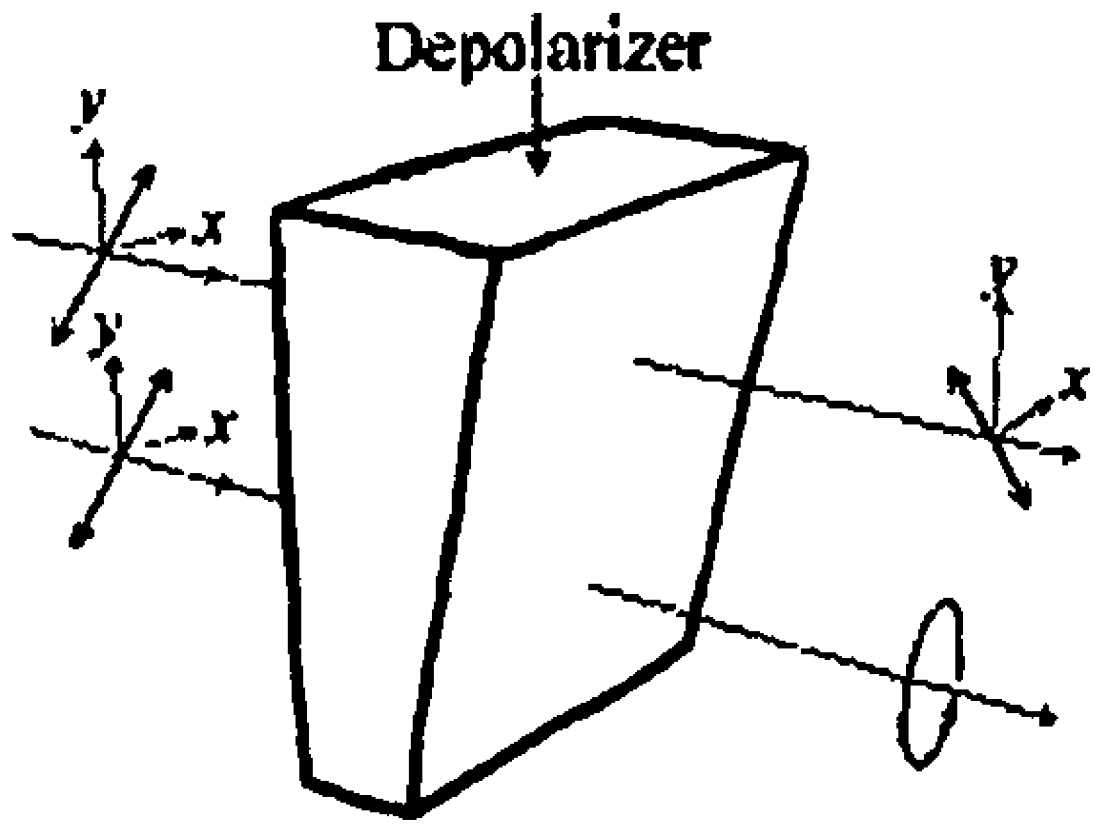
FIG. 6 shows an exemplary depolarizer for converting polarized light into non-polarized light which depolarizer can be positioned, for example, in front of the splitter comprised by the optical focus sensor.

In an embodiment, a depolarizer may be arranged in front of splitter 230. Splitter 230 may have a reflection or transmission ratio that depends on polarization, which dependence might lead to a focus offsets. The depolarizer converts polarized light into non-polarized light so that the polarization dependence can be eliminated. An example of a depolarizer has a wedge shape structure and transmits light through the depolarizer at different thicknesses. A phase difference induced by a birefringent crystal changes with its thickness. Thus, this depolarizer introduces a phase difference that varies continuously. As a result, the light emerging from the depolarizer becomes non-polarized light. See FIG. 6 for an example of a depolarizer.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. An optical focus sensor arranged to generate a focus error signal indicative of a position of a substrate relative to a focal plane of an objective lens, the optical focus sensor comprising:
- a depolarizer constructed and arranged to convert polarized light into a non-polarized light beam; and
- a splitter constructed and arranged to split the non-polarized light beam into a first sub-beam and a second sub-beam associated with respectively a first and a second optical branch, the splitter being further constructed and arranged to direct the first sub-beam to a first detector via a first aperture, and to direct the second sub-beam to a second detector via a second aperture wherein,
  - the first aperture is positioned between a first back focal plane of the objective lens in the first optical branch and the first detector, and
  - the second aperture is positioned between the objective lens and a second back focal plane of the objective lens in the second optical branch.

2. The optical focus sensor of claim 1, comprising a mirror positioned between the splitter and the second aperture, the mirror configured to direct the second sub-beam towards the second aperture.

3. The optical focus sensor of claim 1, comprising a lens configured to transmit the non-polarized light beam to the splitter.

4. The optical focus sensor of claim 1, comprising a first lens configured to transmit the first sub-beam to the first aperture and a second lens configured to transmit the second sub-beam to the second aperture.

5. The optical focus sensor of claim 1, comprising a controller constructed and arranged to generate the focus error signal based on a first detector signal generated by the first detector and a second signal generated by the second detector.

6. The optical focus sensor of claim 1, wherein the depolarizer is positioned in front of the splitter.

7. The optical focus sensor of claim 6, wherein the depolarizer has a wedge shaped structure.

8. An inspection apparatus configured to measure a property of a substrate, the inspection apparatus comprising:
- an illumination source configured to output a radiation;
- an objective lens configured to project the radiation onto the substrate; and
- an optical focus sensor arranged to generate a focus error signal indicative of a position of the substrate relative to a focal plane of an objective lens, the optical focus sensor comprising:
  - a depolarizer constructed and arranged to convert polarized light into a non-polarized light beam; and
  - a splitter constructed and arranged to split the non-polarized light beam into a first sub-beam and a second sub-beam associated with respectively a first and a second optical branch, the splitter being further constructed and arranged to direct the first sub-beam to a first detector via a first aperture, and to direct the second sub-beam to a second detector via a second aperture wherein,
    - the first aperture is positioned between a first back focal plane of the objective lens in the first optical branch and the first detector, and
    - the second aperture is positioned between the objective lens and a second back focal plane of the objective lens in the second optical branch.

9. The inspection apparatus of claim 8, wherein the inspection apparatus is a scatterometer.

10. The inspection apparatus of claim 8, wherein the inspection apparatus is an ellipsometer.

11. A lithographic apparatus comprising:
- an illumination system arranged to illuminate a pattern;
- a projection system arranged to project an image of the pattern onto a substrate; and
- an inspection apparatus configured to measure a property of the substrate, the inspection apparatus comprising:
  - an illumination source configured to output a radiation;
  - an objective lens configured to project the radiation onto the substrate; and
  - an optical focus sensor arranged to generate a focus error signal indicative of a position of the substrate relative to a focal plane of an objective lens, the optical focus sensor comprising:
    - a depolarizer constructed and arranged to convert polarized light into a non-polarized light beam; and
    - a splitter constructed and arranged to split the non-polarized light beam into a first sub-beam and a second sub-beam associated with respectively a first and a second optical branch, the splitter being further constructed and arranged to direct the first sub-beam to a first detector via a first aperture, and to direct the second sub-beam to a second detector via a second aperture wherein,
      - the first aperture is positioned between a first back focal plane of the objective lens in the first optical branch and the first detector, and
      - the second aperture is positioned between the objective lens and a second back focal plane of the objective lens in the second optical branch.

* * * * *